United States Patent [19]

Lee

[11] Patent Number: 4,847,211

[45] Date of Patent: Jul. 11, 1989

[54] METHOD OF MANUFACTURING SEMICONDUCTOR DEVICES AND PRODUCT THEREFROM

[75] Inventor: Michael J. Lee, High Wycombe, England

[73] Assignee: National Research Development Corporation, London, England

[21] Appl. No.: 45,802

[22] Filed: Apr. 27, 1987

Related U.S. Application Data

[63] Continuation of Ser. No. 681,693, Dec. 14, 1984, abandoned, which is a continuation of Ser. No. 317,409, Nov. 2, 1981, abandoned.

[30] Foreign Application Priority Data

Nov. 6, 1980 [GB] United Kingdom ............... 8035635

[51] Int. Cl.$^4$ ........................................... H01L 29/78
[52] U.S. Cl. ...................... 357/4; 357/23.7; 437/247
[58] Field of Search ............ 437/247, 214; 29/571; 148/1.5, 187; 357/23.7, 4, 59

[56] References Cited

U.S. PATENT DOCUMENTS

| | | | |
|---|---|---|---|
| 2,974,075 | 3/1961 | Miller | 437/247 |
| 3,258,663 | 6/1966 | Weimer | 29/571 |
| 3,298,863 | 1/1967 | McCusker | 29/571 |
| 3,349,474 | 10/1967 | Rauscher | 148/1.5 |
| 3,423,821 | 1/1969 | Mishimura | 29/571 |
| 3,460,005 | 8/1969 | Kand et al. | 29/571 |
| 3,520,051 | 7/1970 | Topter et al. | 29/571 |
| 3,620,850 | 11/1971 | Deal | 437/247 |
| 3,627,589 | 12/1971 | Sprague | 148/1.5 |
| 3,885,993 | 5/1975 | Tihanyi | 148/1.5 |
| 3,988,172 | 10/1976 | Bachmann et al. | 148/1.5 |
| 4,055,444 | 10/1977 | Rao | 148/1.5 |
| 4,091,527 | 5/1978 | Goodman et al. | 29/571 |
| 4,116,719 | 9/1978 | Shimuzu et al. | 148/1.5 |
| 4,151,007 | 4/1979 | Levenstein et al. | 148/1.5 |

FOREIGN PATENT DOCUMENTS

| | | |
|---|---|---|
| 1923265 | 6/1972 | Fed. Rep. of Germany . |
| 2382097 | 9/1978 | France . |
| 1250509 | 10/1971 | United Kingdom . |

OTHER PUBLICATIONS

Burr, P. et al., "Single Step Anneal for Thin Film Transistors", IBM Technical Disc. Bull, vol. 22, No. 1, Jun. 1979, p. 353.

Lee, H., "A New Approach for the Floating-Gate MOS Nonvolatile Memory", Appl. Phys. Lett., vol. 31, No. 7, Oct. 1977, pp. 475-476.

Runge, H. "Threshold Voltage Shift of MOS Transistors by Ion Implantation", Electronic Engineering, Jan. 1976, pp. 41-43.

*Primary Examiner*—Christopher W. Brody
*Attorney, Agent, or Firm*—Cushman, Darby & Cushman

[57] ABSTRACT

A thin film semiconductor device, for example a transistor, is fabricated by depositing layers of materials of appropriate electrical characteristics on an insulating substrate 1. To manufacture a transistor, firstly an insulating base layer 2 is applied which is then followed by a gate electrode 3, an insulation layer 4 and a semiconductor layer 5. Source and drain electrodes 6 and 7 are then applied and finally a protective layer 8 encapsulates the device. In order to improve the life of the device it is annealed firstly in a reducing atmosphere and then in an oxidizing atmosphere.

14 Claims, No Drawings

METHOD OF MANUFACTURING SEMICONDUCTOR DEVICES AND PRODUCT THEREFROM

This is a continuation of application Ser. No. 681,693, filed Dec. 14, 1984, which was abandoned upon the filing hereof, which is a continuation of earlier application Ser. No. 317,409, filed Nov. 2, 1981, now abandoned.

This invention relates to methods of manufacturing semiconductor devices. It has application in the manufacture of thin film transistors as well as other semiconductor devices.

A thin film transistor (or TFT) is a thin equivalent of a MOSFET (a metal-oxide-silicon field-effect transistor). It is a high input impedance non-linear device which is useful in switching applications. As with conventional field-effect transistors it has source, drain and gate electrodes. For an n-type enhancement device with a positive voltage applied to the gate there is a low impedance between the source and drain (the 'on' state). With the gate voltage zero there is a high impedance between the source and drain.

It has been suggested that such a device would be useful to switch flat panel matrix displays where each crossover point of the matrix constitutes a picture point in the display. Such displays may employ liquid crystal, electroluminescent, or electrochromic elements. These various types of display would be more effective if a TFT were to be associated with each picture point as an active switch device for the element. Since the area of deposition is only limited by masking, an array of TFTs can be provided over the same dimensions as a display panel and can be integrated with the panel.

For use as a switch in a matrix display a TFT should be stable when operated over long periods of time, should have a sufficiently low impedance when turned 'on' to allow charging of each picture point during the permitted address time, should have a sufficiently high impedance in the 'off' state to prevent decay of the charge to each picture point before the same element is readdressed, and should have a sufficiently large ratio of 'on' current to 'off' current. The problems associated with stability are firstly that there is a slow logarithmic decay of drain current when the device is operated under steady gate bias and secondly there is an ill-defined irreversible decay caused by the atmosphere or by the overlaying layers of the picture elements. In practice the required value of 'on' currents can be readily obtained but it is difficult to achieve a sufficiently low value of 'off' current.

It is an object of the present invention to provide a semiconductor device which is adequately stable and has a low value of 'off' current.

According to the invention a method of fabricating a thin film semiconductor device comprises the steps of depositing layers of materials of appropriate electrical characteristics on an insulating substrate to form such a device, said layers including a semiconductor layer and an insulating layer protecting the semiconductor layer, and annealing the device so formed in an oxidising atmosphere.

Preferably the annealing is carried out firstly in a reducing atmosphere and then in the oxidising atmosphere.

In carrying out the invention the protective insulating layer should have low electrical loss and not be porous and it should not react with the semiconductor layer in a manner which would degrade the required electrical properties. A suitable material for such an insulating layer is silica.

In order that the invention may be more fully understood reference will now be made to the accompanying drawings in which FIG. 1 and FIG. 2 illustrate in cross-section alternative embodiments of TFTs manufactured in accordance with the invention.

Referring now to FIG. 1 a TFT is fabricated by sequential deposition through metal stencil masks of appropriate materials. An insulating substrate 1 of any suitable material, for example aluminosilicate glass has deposited on it a base coat 2 of silica of thickness 100 nm by sputtering. This base coat 2 acts as a smoothing layer and prevents diffusion of contaminants from the substrate.

A gate electrode 3 formed of aluminium of thickness 50 nm is then evaporated through an appropriate mask. An insulator layer 4 of silica of thickness 100 nm is then sputtered followed by the evaporation of a semiconductor layer 5 of cadmium sulphide to a thickness of 40 nm. A source contact and a drain contact of chromium are then evaporated onto the surface of the semiconductor layer 5 through metal masks to a thickness of 50 nm and are backed up by evaporating aluminium layers of 120 nm thickness to form source electrode 6 and drain electrode 7. Finally a silica layer 8 of encapsulant is then sputtered over the top surface of the device to a thickness of 100 nm.

The sputtering operations are carried out by rf sputtering in a 95% argon-5% oxygen mixture and the evaporation operations are carried out by resistive heating.

FIG. 2 shows an alternative construction of a TFT having a substrate 1 and base coat 2 similar to the substrate and base coat of FIG. 1. In the construction of FIG. 2 a source electrode 16 and a drain electrode 17 are deposited directly on base coat 2 and a semiconductor layer 15 is deposited between these electrodes. The source and drain electrodes and the semiconductor layer are then covered by an insulating layer 14 of silica which is deposited by sputtering. Finally a gate electrode 13 is deposited on to the surface of semiconductor layer 15 through metal masks.

In the construction of FIG. 2 it will be seen that insulating layer 14 acts to protect semiconductor layer 15 in a similar manner to the encapsulant layer 8 in the construction of FIG. 1.

While only one TFT is shown in both FIG. 1 and FIG. 2 it will be appreciated that any number of TFTs can be fabricated simultaneously to cover an area corresponding to a display panel.

The fabricated device or array of devices is then subject to an annealing process. In this process the array is annealed for one hour in a reducing atmosphere. Such an atmosphere may comprise a mixture of hydrogen and an inert gas. The purpose of the inert gas is to reduce the concentration of hydrogen to below an explosive level. A suitable mixture is 10% hydrogen and 90% nitrogen and the annealing takes place at a temperature of 380° C. This annealing step is then followed by a second annealing step in which the array is annealed for three hours in an atmosphere of pure oxygen at 380° C.

The thicknesses of the layers quoted above are by way of example only and may be varied as considered suitable. The annealing times can be varied depending on the thickness of the semiconducting and encapsulating layer and for thicker layers a longer time is required. The time of anneal can be shortened by raising the temperature.

It is believed that the effect of the initial annealing in a reducing atmosphere is to remove damage caused by the sputtering process and promote diffusion. The effect of the subsequent annealing in an oxidising atmosphere is to reduce the carrier concentration of the semiconductor layer. It may be possible in certain circumstances to dispense with the initial step of annealing in a reducing atmosphere and rely on the annealing in an oxidising atmosphere. In such cases it may be desirable to increase the annealing time to in excess of 9 hours.

TFTs made in accordance with the above steps have been shown to have decay rates of less than 2.5% per decade corresponding to a 20% change in drain current in six years of continuous operation. Furthermore in accelerated ageing tests the on:off ratio of currents remains substantially constant at about $10^6$ with 'off' currents of less than $6 \times 10^{-11}$ amps.

The method described above can be used for TFTs prepared through stencil masks or by photolithography and etching and applies to all structural configurations. Thus for example in the method described with reference to FIG. 1 the metal layers 6 and 7 may be deposited before the semiconductor layer 5. In the method described with reference to FIG. 2 semiconductor layer 15 may be deposited before metal layers 16 and 17.

The method can be applied to matrix addressed displays using for example liquid crystal, electroluminescent and electrochromic materials and for electrophoretic and vacuum fluorescent displays.

The method is applicable to other insulators or encapsulants in addition to the silicon dioxide described above. Metals other than aluminium can be used for the gate electrode and the source and drain electrodes can be formed of metals other than chromium and aluminium. The anneal process can be used for insulators or encapsulants deposited by techniques other than sputtering, e.g. electron beam evaporation. The method described above is applicable to other thin film active devices, for example to solar cells.

I claim:

1. A method of fabricating a thin film semiconductor device comprising the steps of:
    depositing layers of materials of appropriate electrical characteristics on an insulating substrate to form said device;
    said layers including a layer of a polycrystalline semiconductor compound and an insulating layer protecting the semiconductor layer, and;
    annealing the device so formed in an oxidizing atmosphere of substantially pure oxygen at a temperature and for a time sufficient to reduce the carrier concentration of the semiconductor layer.

2. The method as claimed in claim 1 in which the annealing is carried out firstly in a reducing atmosphere and then in an oxidising atmosphere.

3. The method as claimed in claim 2 in which the reducing atmosphere comprises a mixture of hydrogen and an inert gas.

4. The method as claimed in claim 2 in which the reducing atmosphere comprises a mixture of 10% hydrogen and 90% nitrogen.

5. The method as claimed in claim 2 in which annealing in a reducing atmosphere takes place at approximately 380° C.

6. The method as claimed in claim 1 in which the insulating layer comprises silica.

7. A thin film semiconductor device fabricated according to a method comprising the steps of:
    depositing layers of materials of appropriate electrical characteristics on an insulating substrate to form said device;
    said layers including a layer of a polycrystalline semiconductor compound and an insulating layer protecting the semiconductor layer, and;
    annealing the device so formed in an oxidizing atmosphere of substantially pure oxygen at a temperature and for a time sufficient to reduce the carrier concentration of the semiconductor layer.

8. A semconductor device as in claim 7, wherein said device comprises an array of thin film semiconductor devices all fabricated on a common substrate in accordance with the stated method.

9. The method as in claim 1 wherein the annealing step is carried out at a temperature of approximately 380° C.

10. The device as in claim 7 wherein the annealing step is carried out at a temperature of approximately 380° C.

11. The method as claimed in claim 1 in which the polycrystalline semiconductor compound includes cadmium.

12. The method as claimed in claim 1 in which the polycrystalline semiconductor compound is a Group II and VI compound.

13. A semiconductor device as in claim 7, wherein said polycrystalline semiconductor compound includes cadmium.

14. A semiconductor device as in claim 7, wherein said polycrystalline semiconductor compound is a Group II and VI compound.

* * * * *